(12) United States Patent
Kim et al.

(10) Patent No.: US 9,614,512 B2
(45) Date of Patent: Apr. 4, 2017

(54) GATE DRIVER AND METHOD OF DRIVING THE SAME

(71) Applicant: Samsung SDI Co., Ltd., Yongin-si, Gyeonggi-do (KR)

(72) Inventors: Suk-Ki Kim, Yongin-si (KR); Kyu-Sung Cho, Yongin-si (KR); Jung-Pil Park, Yongin-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/865,732

(22) Filed: Sep. 25, 2015

(65) Prior Publication Data

US 2016/0173068 A1    Jun. 16, 2016

(30) Foreign Application Priority Data

Dec. 12, 2014  (KR) .......................... 10-2014-0179519

(51) Int. Cl.
| | | |
|---|---|---|
| *H03B 1/00* | (2006.01) | |
| *H03K 3/00* | (2006.01) | |
| *H03K 7/06* | (2006.01) | |
| *H03K 17/687* | (2006.01) | |
| *H03K 17/691* | (2006.01) | |

(52) U.S. Cl.
CPC ............. *H03K 7/06* (2013.01); *H03K 17/687* (2013.01); *H03K 17/691* (2013.01)

(58) Field of Classification Search
CPC . H03K 17/16; H03K 17/04126; H03K 17/063
USPC ........ 327/108–112, 427, 434, 437, 170–175; 326/82, 83, 87; 363/21.02, 127
See application file for complete search history.

(56) References Cited

U.S. PATENT DOCUMENTS

| | | | | |
|---|---|---|---|---|
| 2,862,165 A | * | 11/1958 | Younkin | G05D 3/18 318/599 |
| 4,481,431 A | * | 11/1984 | Nishino | H03K 17/0424 327/374 |
| 5,781,040 A | * | 7/1998 | Myers | H03K 17/691 327/109 |
| 2005/0151585 A1 | | 7/2005 | Honda et al. | |
| 2012/0188794 A1 | | 7/2012 | Chang et al. | |

FOREIGN PATENT DOCUMENTS

| | | |
|---|---|---|
| KR | 10-1999-0051463 A | 7/1999 |
| KR | 10-0645310 B1 | 11/2006 |
| KR | 10-2006-0126541 A | 12/2006 |
| KR | 10-2012-0086646 A | 8/2012 |

* cited by examiner

*Primary Examiner* — Lincoln Donovan
*Assistant Examiner* — Thomas Skibinski
(74) *Attorney, Agent, or Firm* — Knobbe, Martens, Olson & Bear, LLP

(57) ABSTRACT

A gate driver and a method of driving the same are disclosed. In one aspect, the gate driver includes a switching device, a pulse generator configured to generate a pulse signal. The gate driver also includes a pulse transformer configured to generate a gate voltage based on the pulse signal and apply the gate voltage to the switching device. The pulse generator is further configured to control the switching device by modifying a frequency of the pulse signal.

7 Claims, 2 Drawing Sheets

High : Low = 1 : n  => maintain duty ratio

GATE DRIVER AND METHOD OF DRIVING THE SAME

CROSS-REFERENCE TO RELATED APPLICATION

This application claims priority to and the benefit of Korean Patent Application No. 10-2014-0179519, filed on Dec. 12, 2014, in the Korean Intellectual Property Office, the entire content of which is incorporated herein by reference in its entirety.

BACKGROUND

Field

The described technology generally relates to a gate driver and a method of driving the same.

Description of the Related Technology

Switching devices (for example, insulated-gate bipolar transistors (IGBTs) and field effect transistors (FETs)) are used in various kinds of electric devices including power converters which supply power, inverters, and the like.

For example, in hybrid or electric cars, the application of power to the motor is controlled using a switching device (e.g., an IGBT and/or FET device, or the like). Here, the battery power source and the switching device are electrically insulated from each other. This insulation between the battery power source and the switching device is a very important factor in safety and reliability. The insulation resistance and insulation strength of the insulation between the devices is subjected to testing standards.

SUMMARY OF CERTAIN INVENTIVE ASPECTS

One inventive aspect is a gate driver including a switching device, a pulse generator for generating a pulse signal, and a pulse transformer for generating a gate voltage to be supplied to the switching device in response to the pulse signal, wherein the pulse generator controls operations of the switching device by modifying a frequency of the pulse signal.

The pulse generator can increase the frequency of the pulse signal when the operations of the switching device are stopped.

The pulse generator can generate the pulse signal of a first frequency during a normal driving period of the switching device and gradually modify the pulse signal from the first frequency to a second frequency that is higher than the first frequency when the operations of the switching device are stopped.

A duty ratio of the pulse signal can be consistent regardless of change in the frequency.

A boosting unit between the pulse generator and the pulse transformer can boost a voltage of the pulse signal.

Another aspect is a method of driving a gate driver, including, generating a gate voltage for turning on and turning off a switching device in response to a pulse signal input to a pulse transformer, and changing a frequency of the pulse signal when operations of the switching device are stopped.

The frequency of the pulse signal can gradually increase from a first frequency to a second frequency higher than the first frequency when the operations of the switching device are stopped.

A duty ratio of the pulse signal can be consistent regardless of the change in the frequency.

Another aspect is a gate driver comprising a switching device; a pulse generator configured to generate a pulse signal; and a pulse transformer configured to generate a gate voltage based on the pulse signal and apply the gate voltage to the switching device, wherein the pulse generator is further configured to control the switching device by modifying a frequency of the pulse signal.

In exemplary embodiments, the pulse generator is further configured to increase the frequency of the pulse signal so as to transition the switching device into an idle state. The pulse generator can be further configured to generate: i) the pulse signal so as to have a first frequency during a normal driving period of the switching device and ii) gradually modify the pulse signal from the first frequency to a second frequency that is higher than the first frequency so as to transition the switching device into the idle state. The pulse signal can have a duty ratio that is substantially constant when the frequency of the pulse signal is modified. The gate driver can further comprise a boosting unit electrically connected between the pulse generator and the pulse transformer, wherein the boosting unit is configured to boost the voltage of the pulse signal.

Another aspect is a method of driving a gate driver comprising receiving a pulse signal at a pulse transformer; generating, via the pulse transformer, a gate voltage for turning on and turning off a switching device in response to the pulse signal; and changing a frequency of the pulse signal so as to transition the switching device into an idle state.

In exemplary embodiments, the changing of the frequency of the pulse signal comprises gradually increasing the frequency from a first frequency to a second frequency that is higher than the first frequency. The method can further comprise maintaining a duty ratio of the pulse signal to be substantially constant when changing the frequency of the pulse signal. The method can further comprise boosting the voltage of the pulse signal, via a boosting unit, prior to the generating of the gate voltage.

According to at least one embodiment, when operations of the switching device are stopped, the frequency of pulse signal supplied to the pulse transformer gradually increase, and accordingly, the remaining energy between the first and second coils of the pulse transformer is stably removed. In other words, when operations of the switching device are stopped, undesired gate voltage can be prevented from being generated in a pulse transformer due to the remaining energy. As a result, reliability of the gate driver can be enhanced.

DETAILED DESCRIPTION OF CERTAIN INVENTIVE EMBODIMENTS

Figure 1:
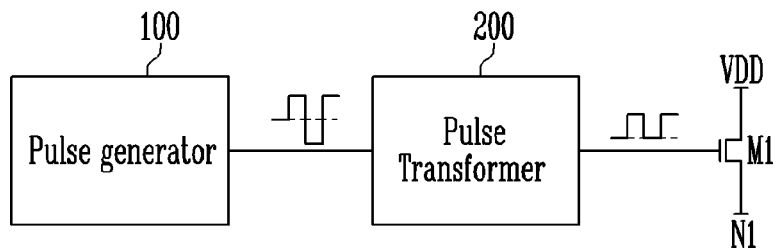
FIG. 1 illustrates a gate driver according to an embodiment.

Gate drivers can include pulse transformers and pulse generators which control the switching of switching devices placed between a power source and a load. The pulse transformers electrically insulate the switching devices from the pulse generators. However, when a pulse transformer is used, the switching device may be triggered at times that are not in accord with intended design. This false triggering is due to the energy remaining between a first coil and a second coil of the pulse transformer when the pulse generator terminates the supply of a pulse signal.

For example, when the supply of the pulse signal is terminated, a residual voltage having a sine waveform is applied to the switching device due to the remaining energy between the first and second coils. The sine waveform voltage supplied to the switching device may cause undesired operation of the switching device, such as false triggering, thereby reducing its reliability. Furthermore, when the sine waveform voltage is applied to the switching device after the pulse signal is terminated, stress is generated in the switching device since a gate voltage is continuously applied to the switching device.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete and will fully convey the scope of the described technology to enable those skilled in the art to make and use the described technology.

In the drawings, the dimensions of the illustrated elements may be exaggerated for the sake of clarity. It will be understood that when an element is referred to as being "between" two elements, it can be the only element between the two elements, or one or more intervening elements may also be present. Like reference numerals refer to like elements throughout.

In the following detailed description, only certain exemplary embodiments have been shown and described, simply by way of illustration. As those skilled in the art would realize, the described embodiments may be modified in various different ways, all without departing from the spirit or scope of the described technology. Accordingly, the drawings and description are to be regarded as illustrative in nature and not restrictive. In addition, it will be understood that when an element or layer is referred to as being "on", "connected to" or "coupled to" another element or layer, it can be directly on, connected or coupled to the other element or layer or intervening elements or layers may also be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the described technology.

Spatially relative terms, such as "beneath", "below", "lower", "above", "upper" and the like, may be used herein to facilitate description of the described technology to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both the orientations of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the described technology. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the described technology belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a gate driver according to an embodiment. The gate driver can control a switching device according to an insulation method and can be applied in various devices including an inverter, a converter and a power conversion device.

Referring to FIG. 1, the gate driver includes a pulse generator 100, a pulse transformer 200 and a switching device M1.

The pulse generator 100 can generate a pulse signal that includes a repeating high voltage and low voltage. The pulse generator 100 can generate a pulse signal having a consistent duty ratio, e.g., a substantially constant duty ratio, and can supply the generated pulse signal to the pulse transformer 200.

The pulse transformer 200 can insulate the pulse generator 100 from the switching device M1. The pulse transformer 200 can generate a gate voltage in response to a pulse signal. For example, the pulse transformer 200 can generate a gate voltage that can turn on the switching device M1 during a high voltage section of the pulse signal and generate a gate voltage that can turn off the switching device M1 during a low voltage section of the pulse signal.

The switching device M1 is interposed between a first power source VDD and a first node N1. The switching device M1 can be turned on and turned off in response to a gate voltage and can supply the first power source VDD to the first node N1 when the switching device M1 is turned on.

In FIG. 1, although the switching device M1 is illustrated as being interposed between the first power source VDD and the first node N1, the described technology is not limited thereto. For example, the switching device M1 can be connected to the first node N1 and a second power source (e.g., ground power source) that is lower than the first power source VDD. The first node N1 can be connected to various circuits based on the location of the switching device M1.

Figure 2:
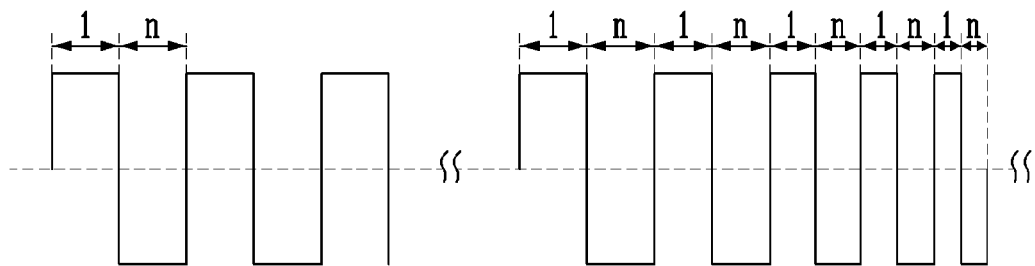
FIG. 2 illustrates the operations of a pulse generator according to an embodiment.

FIG. 2 illustrates the operations of a pulse generator according to an embodiment. As used herein, the stopping or termination of the operations of the switching device M1 generally refers to setting the switching device M1 to an idle state for a fixed period. The switching device M1 can be repeatedly turned on and off during a normal driving period. After the operations are stopped, the switching device can be maintained in a turned-off state for a fixed period.

Referring to FIG. 2, the pulse generator 100 can generate a pulse signal having a consistent duty ratio during a normal driving period of the switching device M1 and the generated pulse signal can be supplied to the pulse transformer 200.

As used herein, the duty ratio generally refers to the ratio of the pulse width with respect to the period of the pulse signal. For example, when the width of the high voltage portion of the pulse signal (for example, a positive (+) voltage) and the width of the low voltage portion of the pulse signal (for example, a negative (−) voltage) is substantially the same, the duty ratio is about 50%. The pulse generator 100 can generate a pulse signal such that the low voltage portion of the pulse signal has a value of "n" (where n is a real number) when the high voltage portion of the pulse signal is set to "1" such that the duty ratio of the pulse signal is 1:n.

When the pulse signal having a duty ratio of 1:n is generated by the pulse generator 100, the pulse transformer 200 can generate a gate voltage in response to the pulse signal having a duty ratio of 1:n and control the turning on and off of the switching device M1 using the generated gate voltage.

When the operations of the switching device M1 are stopped after the normal driving period of the switching device M1, the pulse generator 100 can gradually increase the frequency of the pulse signal. For example, the pulse generator 100 can gradually increase the frequency of the pulse signal from a first frequency to a second frequency higher than the first frequency.

As used herein, the second frequency generally refers to a frequency which the pulse transformer 200 cannot recognize. In other words, the second frequency is high enough that the gate voltage for turning on the switching device M1 is not generated by the pulse transformer 200. The second frequency can be set in advance in consideration of the capacity of the pulse transformer 200 and the like. In some embodiments, the second frequency is set to about 10 Khz. When the operations of the switching device M1 are stopped and the frequency of the pulse signal gradually increases, the remaining energy between the first coil and the second coil of the pulse transformer 200 can be removed.

When the operations of the switching device M1 are stopped, the pulse generator 100 can gradually increase the frequency of the pulse signal from the first frequency to the second frequency. The pulse transformer 200 can generate high and low gate voltages at an increasingly faster rate, and accordingly, the remaining energy between the first and second coils can be gradually removed. When the frequency of the pulse signal is increased to the second frequency, the pulse transformer 200 does not generate the gate voltage for turning on the switching device M1. However, the remaining energy between the first and second coils can be removed due to the pulse signal of the second frequency supplied to the pulse transformer 200.

In other words, when the operations of the switching device M1 are stopped, the remaining energy can be removed as the frequency of the pulse signal is gradually increased to the second frequency from the first frequency. Further, the gate voltage that would otherwise be generated from the remaining energy of the pulse transformer 200 is prevented from being generated and reliability of the gate driver can be improved.

Furthermore, the pulse generator 100 can maintain the duty ratio to be consistent even though the frequency of the pulse signal changes (that is, the high and low periods are maintained to have a duty ratio of about 1:n). While the duty ratio of the pulse signal is maintained to be consistent, the remaining energy of the pulse transformer 200 can be removed using the frequency of the pulse signal only.

Figure 3:
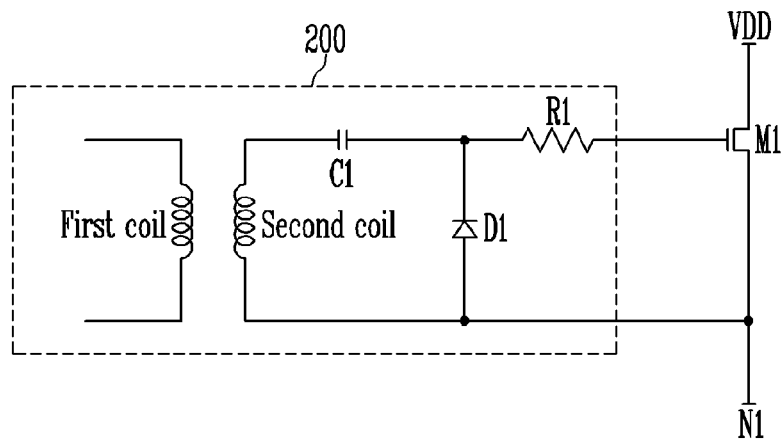
FIG. 3 illustrates a pulse transformer according to an embodiment.

FIG. 3 illustrates a pulse transformer according to an embodiment.

Referring to FIG. 3, the pulse transformer 200 includes a first coil, a second coil, a capacitor C1, a diode D1 and a resistor R1.

The first and second coils are arranged to be electrically insulated from each other. The first coil can generate a predetermined electrical energy in response to a pulse signal received from a pulse generator 100. The second coil can generate a gate voltage using electrical energy generated by the first coil. The gate voltage is based on the turn ratio between the first and second coils, the duty ratio of the pulse signal, and the like.

The capacitor C1 and the resistor R1 are connected between the gate electrode of the switching device M1 and the second coil. The diode D1 is connected between the first node N1 and a common node between the capacitor C1 and the resistor R1. In other words, the diode D1 is connected in parallel to the second coil.

The capacitor C1, the resistor R1 and the diode D1 can be used as a direct current (DC) generating circuit. For example, the duty ratio of the pulse signal received from the pulse generator 200 can be rectified as a DC voltage at the diode D1 and charged to the capacitor C1, and thus the level of the DC potential of the second coil can be maintained to be consistent.

FIG. 3 is only an embodiment of the pulse transformer 200 and the described technology is not limited thereto. For example, the pulse transformer 200 can be implemented by various circuits having differing configurations that have been disclosed in the industry.

Figure 4:
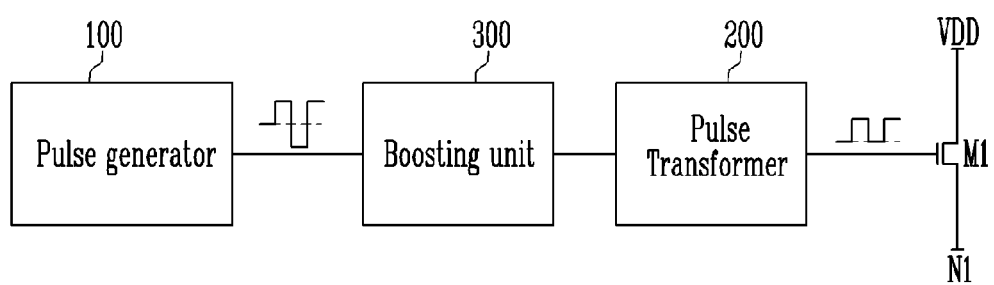
FIG. 4 illustrates a gate driver according to another embodiment.

FIG. 4 illustrates a gate driver according to another embodiment. Reference numerals in FIG. 4 are given the same reference numerals found in FIG. 1 and descriptions thereof will be omitted.

Referring to FIG. 4, the gate driver includes a boosting unit 300 connected between a pulse generator 100 and a pulse transformer 200. The boosting unit 300 can boost the voltage of a pulse signal received from the pulse generator 100 and supply the boosted voltage to the pulse transformer 200.

Figure 5:
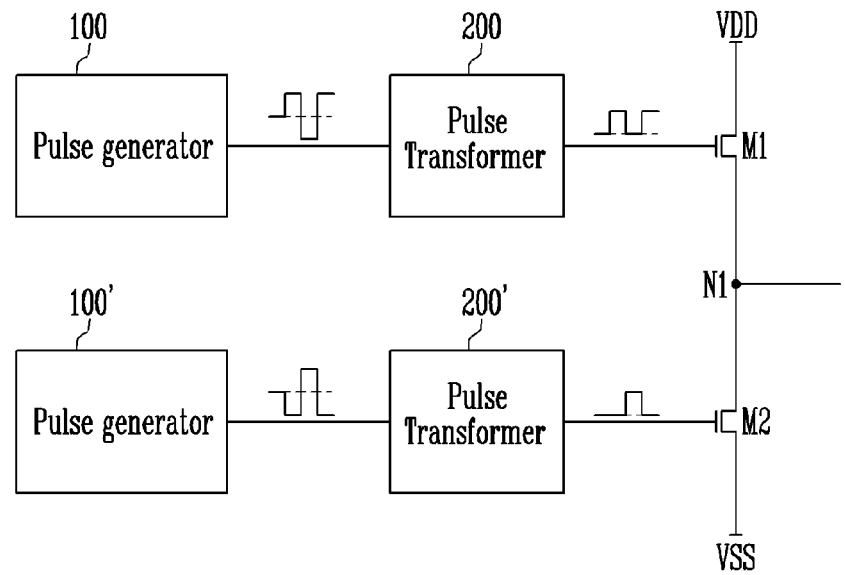
FIG. 5 illustrates a gate driver according to yet another embodiment.

FIG. 5 illustrates a gate driver according to yet another embodiment.

Referring to FIG. 5, a first switching device M1 and a second switching device M2 are electrically connected between a first power source VDD and a second power source VSS that is set to a lower voltage than the first power source VDD. A first node N1 that is a common node of the first switching device M1 and the second switching device M2 can be connected to a predetermined circuit.

The first switching device M1 can be operated by a first pulse generator 100 and a first pulse transformer 200.

The second switching device M2 can be operated by a second pulse generator 100' and a second pulse transformer 200'. The respective structures and the functions of the pulse generators 100 and 100' and the pulse transformers 200 and 200' are the same as described with reference to FIG. 1.

However, the first pulse generator 100 and the second pulse generator 100' can generate pulse signals having a predetermined phase difference, for example, a 180° phase difference. The first switching device M1 and the second switching device M2 can be alternatively turned on and turned off, thereby supplying voltage of the first power source VDD or the second power source VSS to the first node N1.

When the operations of the switching devices M1 and M2 are stopped, the switching devices M1 and M2 can be turned off as the first pulse generator 100 and the second pulse generator 100' gradually increase the frequency of the pulse signal. Since the pulse signals generated by the first pulse generator 100 and the second pulse generator 100' have a phase difference of about 180°, the switching devices M1 and M2 are not concurrently turned-on, and as a result, the safety of the gate driver is improved.

The first pulse generator 100 and the second pulse generator 100' can prevent false triggering of the switching devices M1 and M2 as the remaining energy of the pulse transformer 200 and 200' is removed when the frequency of the pulse signal is gradually increased.

Exemplary embodiments have been disclosed herein, and although specific terms are employed, they are used and are to be interpreted in a generic and descriptive sense only and not for the purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the invention as set forth in the following claims.

What is claimed is:

1. A gate driver, comprising:
   a switching device;
   a pulse generator configured to generate a pulse signal; and
   a pulse transformer configured to generate a gate voltage based on the pulse signal and apply the gate voltage to the switching device,
   wherein the pulse generator is further configured to control the switching device by gradually increasing a frequency of the pulse signal so as to transition the switching device into an idle state.

2. The gate driver of claim 1, wherein the pulse generator is further configured to generate: i) the pulse signal so as to have a first frequency during a normal driving period of the switching device and ii) gradually increase the pulse signal from the first frequency to a second frequency that is higher than the first frequency so as to transition the switching device into the idle state.

3. The gate driver of claim 1, wherein the pulse signal has a duty ratio that is substantially constant when the frequency of the pulse signal is increased.

4. The gate driver of claim 1, further comprising a boosting unit electrically connected between the pulse generator and the pulse transformer, wherein the boosting unit is configured to boost the voltage of the pulse signal.

5. A method of driving a gate driver, comprising:
   receiving a pulse signal at a pulse transformer;
   generating, via the pulse transformer, a gate voltage for turning on and turning off a switching device in response to the pulse signal; and
   gradually increasing a frequency of the pulse signal from a first frequency to a second frequency that is higher than the first frequency so as to transition the switching device into an idle state.

6. The method of claim 5, further comprising maintaining a duty ratio of the pulse signal to be substantially constant when changing the frequency of the pulse signal.

7. The method of claim 5, further comprising boosting the voltage of the pulse signal, via a boosting unit, prior to the generating of the gate voltage.

* * * * *